US006605199B2

(12) United States Patent
Perry et al.

(10) Patent No.: US 6,605,199 B2
(45) Date of Patent: Aug. 12, 2003

(54) TEXTURED-METASTABLE ALUMINUM ALLOY SPUTTER TARGETS AND METHOD OF MANUFACTURE

(75) Inventors: Andrew C. Perry, Oradell, NJ (US); Paul S. Gilman, Suffern, NY (US); Jaak Van den Sype, Katonah, NY (US)

(73) Assignee: Praxair S.T. Technology, Inc., North Haven, CT (US)

( * ) Notice: Subject to any disclaimer, the term of this patent is extended or adjusted under 35 U.S.C. 154(b) by 0 days.

(21) Appl. No.: 09/991,851

(22) Filed: Nov. 14, 2001

(65) Prior Publication Data

US 2003/0089430 A1 May 15, 2003

(51) Int. Cl.$^7$ .......................... C23C 14/34; C22C 21/00; C22C 21/12; C22C 21/04; C22C 21/02
(52) U.S. Cl. .......................... 204/298.13; 204/298.12; 148/437; 148/438; 420/528; 420/529; 420/537; 420/548
(58) Field of Search ........................ 204/298.12, 298.13; 148/437, 438; 420/528, 529, 537, 548

(56) References Cited

U.S. PATENT DOCUMENTS

| | | | |
|---|---|---|---|
| 4,083,220 A | 4/1978 | Kobayashi et al. | 72/364 |
| 4,159,217 A | 6/1979 | Selines et al. | 148/11.5 A |
| 5,600,989 A | 2/1997 | Segal et al. | 72/253.1 |
| 5,766,380 A | 6/1998 | Lo et al. | 148/577 |
| 5,809,393 A * | 9/1998 | Dunlop et al. | 419/61 |
| 5,993,575 A | 11/1999 | Lo et al. | 148/577 |
| 5,993,621 A | 11/1999 | Liu | 204/298.12 |
| 6,197,129 B1 | 3/2001 | Zhu et al. | 148/400 |
| 2001/0054457 A1 * | 12/2001 | Segal et al. | 148/438 |

FOREIGN PATENT DOCUMENTS

| | | | |
|---|---|---|---|
| EP | 799905 | 10/1997 | C23C/14/34 |
| JP | 3115562 | 5/1991 | C23C/14/34 |
| WO | 0015863 | 3/2000 | C23C/14/34 |

OTHER PUBLICATIONS

Rigney et al., "Deformation Substructures Associated with Very Large Plastics Strains", Scripta Metallurgica, vol. 27, (1992) pp 975–980.
Valiev et al., "Structure and Mechanical Behavior of Ultrafine–Grained Metals and Alloys Subjected to Intense Plastic Deformation", Physics of Metals and Metallography, vol. 85, No. 3 (1998) pp. 367–377.
Kiyotaka et al., "Influence of Channel Angle on the Development of Ultrafine Grains in Equal–Channel Angular Pressing", vol. 46, No. 5, (1998) pp 1589–1599.
Shin et al., Grain Refinement of a Commercial 0.15%C Steel by Equal–Channel Angular Pressing, Scripta Materialia, vol. 41, No. 3, (1999) pp 259–262.
Tsuji et al., "Ultra–Fine Grained Bulk Steel Produced by Accumulative Roll–Bonding (ARB) Process", Scripta Materialia, vol. 40, No. 7, (1999) pp 795–800.
Sun et al., "Characteristics of Submicron Grained Structure Formed in Aluminum by Equal Channel Angular Extrusion", Materials Science and Engineering, (2000) pp 82–85.

* cited by examiner

*Primary Examiner*—Steven H. Ver Steeg
(74) *Attorney, Agent, or Firm*—Iurie A. Schwart

(57) ABSTRACT

An aluminum alloy sputter target having a sputter target face for sputtering the sputter target is provided. The sputter target face has a textured-metastable grain structure. The textured-metastable grain structure has a grain orientation ratio of at least 35 percent (200) orientation. The textured-metastable grain structure is stable during sputtering of the sputter target. The textured-metastable grain structure has a grain size of less than 5 μm. The method forms aluminum alloy sputter targets by first cooling an aluminum alloy target blank to a temperature of less than −50° C. Then deforming the cooled aluminum alloy target blank introduces plastic strain into the target blank and reduces the grain size of the grains to form a textured-metastable grain structure. Finally, finishing the aluminum alloy target blank forms a finished sputter target that maintains the textured-metastable grain structure of the finished sputter target.

11 Claims, 4 Drawing Sheets

TEXTURED-METASTABLE ALUMINUM ALLOY SPUTTER TARGETS AND METHOD OF MANUFACTURE

BACKGROUND OF THE INVENTION

In recent years, manufacturers have relied upon several processing techniques to manufacture sputter targets from aluminum alloys such as, aluminum-copper aluminum-silicon and aluminum-silicon-copper alloys. Manufacturers have traditionally relied upon a combination of cold working and annealing to produce a fine-grained aluminum alloy target. The annealing recrystallizes the grains to produce a useful grain texture for sputtering. The final grain size of these annealed targets typically ranges from 30 to 75 µm. Reducing a target's grain size from these levels could further improve sputter uniformity.

Target manufacturers have relied upon equal channel angular extrusion (ECAE) to produce fine aluminum-alloy microstructures. Nakashima et al., "Influence of Channel Angle on the Development of Ultrafine Grains in Equal-Channel Angular Pressing," Acta. Mater., Vol. 46, (1998), pp. 1589–1599 and R. Z. Valiev et al. and "Structure and Mechanical Behavior of Ultrafine-Grained Metals and Alloys Subjected to Intense Plastic Deformation," Phys. Metal. Metallog., Vol. 85, (1998), pp. 367–377 provide examples of using ECAE to reduce grain size. ECAE introduces an enormous strain into a metal without imparting significant changes in workpiece shape. Although this process is effective for reducing grain size, it does not appear to align grains in a manner that facilitates uniform sputtering or provide an acceptable yield-the low yield originates from the ECAE process operating only with rectangular-shaped plate and thus, requiring an inefficient step of cutting circular targets from the rectangular plate.

Another mechanical method to produce fine grain structures in metals is "accumulative roll bonding" where aluminum sheets are repeatedly stacked and rolled to impart sufficient strain required for ultra-fine grain sizes. N. Tsuji et al., "Ultra-Fine Grained Bulk Steel Produced by Accumulative Roll Bonding (ARB) Process," Scripta. Mater., Vol. 40, (1999), pp. 795–800. The repeated stacking and rolling allows rolling to continue after the metal reaches a critical thickness. Although this process is useful for producing some products, the method often introduces undesirable oxides into the finished product.

Researchers have explored using cryogenic working to increase the forming limits of aluminum alloy sheet panels. For example, Selines et al. disclose a cryogenic process for deforming aluminum sheet in U.S. Pat. No. 4,159,217. This cryogenic process increases elongation and formability at −196° C. In addition, similar work has focussed on increasing the formability of sheet panels for automotive applications. Key references include: i) H. Asao et al., "Investigation of Cryogenic Working. I. Deformation Behaviour and Mechanism of Face-Centered Cubic Metals and Alloys at Cryogenic Temperature," J. Jpn. Soc. Technol. Plast., Vol. 26, (1985), pp. 1181–1187; and ii) H. Asao et al., "Investigation of Cryogenic Working. II. Effect of Temperature Exchange on Deformation Behavior of Face-Centered Cubic Metals and Alloys," J. Jpn. Soc. Technol. Plast., Vol. 29, (1988), pp. 1105–1111.

Lo, et al., in U.S. Pat. No. 5,766,380, entitled "Method for Fabricating Randomly Oriented Aluminum Alloy Sputtering Targets with Fine Grains and Fine Precipitates" disclose a cryogenic method for fabricating aluminum alloy sputter targets. This method uses cryogenic processing with a final annealing step to recrystallize the grains into a desired texture. Similarly, Y. Liu, in U.S. Pat. No. 5,993,621 uses cryogenic working and annealing to manipulate and enhance crystallographic texture of titanium sputter targets.

SUMMARY OF THE INVENTION

The invention is an aluminum alloy sputter target having a sputter target face for sputtering the sputter target. The sputter target face has a textured-metastable grain structure. The textured-metastable grain structure has a grain orientation ratio of at least 35 percent (200) orientation. The textured-metastable grain structure is stable during sputtering of the sputter target. The textured-metastable grain structure has a grain size of less than 5 µm.

The method of forming aluminum alloy sputter targets first includes the step of cooling an aluminum alloy target blank to a temperature of less than −50 ° C. The aluminum alloy target blank has grains of a grain size. Then deforming the cooled aluminum alloy target blank introduces plastic strain into the target blank and reduces the grain size of the grains to form a textured-metastable grain structure. Finally, finishing the aluminum alloy target blank at a low temperature sufficient to maintain the textured-metastable grain structure forms a finished sputter target.

DETAILED DESCRIPTION

Figure 1A:
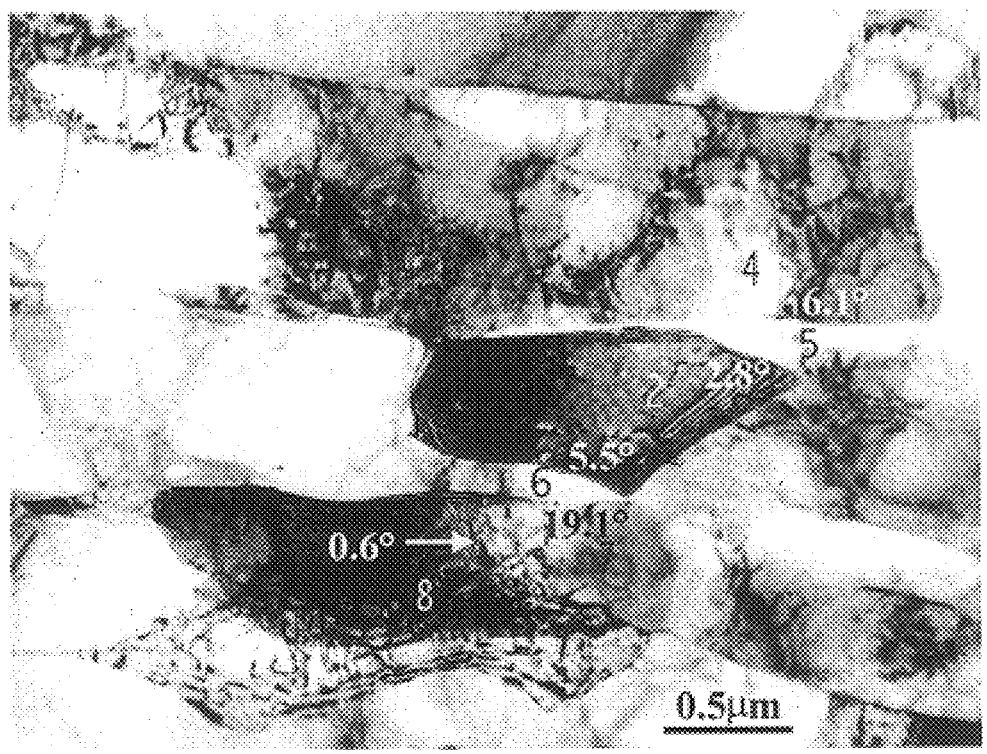
FIG. 1A depicts a transmission electron micrograph of a sample from an ambient-temperature worked Al-0.5Cu target blank taken at a magnification of 33,000× and it includes measurements of low-angle subgrain boundary mismatch.

It has been discovered that lowering deformation temperature for an aluminum-alloy blank to at least −50° C. results in a textured-metastable grain structure having an ultra-fine grain size. Advantageously the process produces a target textured preferentially in the close-packed direction. The metastable product provides acceptable stability for sputtering at temperatures less than 200° C.

This process produces aluminum alloy sputter targets having less than about 10 percent recrystallized grains. Advantageously, the sputter target contains less than about 5 percent recrystallized grains. Most advantageously, the sputter target contains less than 2 percent recrystallized grains.

This process is effective for aluminum alloy targets. The cryogenic process is particularly effective for aluminum-copper, aluminum-silicon, aluminum-copper-silicon and aluminum-silicon-copper alloys. Typical alloys will contain between about 0.2 and 5 weight percent copper plus silicon. Unless specifically referenced otherwise, this specification refers to all composition by weight percent. Examples of particular alloys include Al-0.5Cu and Al-1Si-0.5Cu.

The finished grains have a grain size of less than about 5 µm. For purposes of the specification grain size refers to grain size under ASTM E-112, using both grain boundaries and the high-angle subgrain boundaries formed by cryogenic processing. For purposes of this specification high-angle subgrain boundaries are subgrain-to-subgrain mismatch angles above about 15 degrees. This represents a significant improvement in grain size over standard aluminum alloy sputter targets. Furthermore, this process can advantageously maintain grain size to levels less than about 2 µm. Most advantageously, this process maintains grain size at levels below about 1 µm.

In addition, this process achieves a predominant (200) grain orientation ratio. For purposes of this specification, orientation ratio defines the relative proportion of a particular grain orientation in relation to total grains, expressed in percent as measured perpendicular to a sputter target's face. For example, measuring the intensity of an x-ray peak and dividing it by the relative intensity of that peak as measured in a random orientation powder standard calculates grain orientation ratio. This ratio is then multiplied by 100 percent and normalized, i.e. divided by the sum of all grain orientation ratios between the intensities and their corresponding relative intensities.

The finished sputter target face advantageously has a grain orientation ratio of at least about 35 percent (200) orientation. Most advantageously, the sputter target face has at least 40 percent (200) orientation. In addition, the sputter target face most advantageously has a grain orientation ratio of at least about 35 percent (200) orientation and about 5 to 35 percent of each of the (111), (220) and (311) orientations. This combination of a weighted (200) orientation and balanced (111), (220) and (311) orientations provides the most uniform sputter properties from the sputter target face.

First cooling an aluminum alloy target blank to a temperature of less than about −50° C. prepares the blank for deformation. The cooling medium may be any combination of solid or liquid $CO_2$, liquid nitrogen, liquid argon, helium, or other supercooled liquid. Advantageously, the process lowers the blank to about −80° C. Most advantageously, the process cools the blank to at least about −196° C. or 77 K. The most practical temperature for most applications is 77 K (liquid nitrogen at atmospheric pressure).

After cooling, deforming the cooled aluminum alloy target blank introduces intense plastic strain into the aluminum alloy target blank and reduces the grain size of the grains. The mechanism of the reduction in grain size is the forced subdivision of the original grains into subgrains whose subboundaries eventually develop into high angle boundaries with continued intense plastic straining. Deforming at cryogenic temperatures limits the degree of dynamic recovery that takes place during deformation, which facilitates the evolution of high-angle grain boundaries within original grain interiors. The finished product's textured-metastable microstructure contains deformation-induced-high-angle boundaries with a relative small fraction of original grain boundaries. The deforming process include processes such as pressing, rolling, and forging to achieve ultrafine grain sizes in aluminum alloys. During deformation, it is important to limit heating of the target blank. Furthermore, it is advantageous to impose an engineering strain of at least about 50 percent into the target blank. This strain ensures uniform textured-metastable microstructure through the target's thickness.

Rolling has proven to be the most advantageous method for reducing grain size and controlling grain texture. In particular, multiple pass rolling, with re-cooling between passes provides the most advantageous results.

The finishing of the aluminum alloy target blank into a finished sputter target occurs at a temperature sufficient to maintain the ultra-fine grain size. If the sputter target is finished at too high of a temperature, then the beneficial grain size reduction is lost. Advantageously, the finishing occurs at a temperature less than about 200° C. to limit grain growth. Reducing finishing temperature to less than about 100° C. further decreases the likelihood of grain growth during finishing. Most advantageously, the finishing occurs at ambient temperature.

Similarly, with the textured-metastable grain size it's important to sputter at a temperature less than about 200° C. Maintaining sputter temperature below 200° C. prevents grain growth during sputtering and facilitates uniform sputtering throughout the life of the target. Most advantageously, sputtering occurs with a target maintained at a temperature below about 150° C.

Example 1

Small coupons of size 2.25" (57 mm) diameter and 1.0" (25.4 mm) thick of Al-0.5Cu were cooled in liquid nitrogen in order to be subjected to cryogenic deformation. The coupons were pressed in two steps to a height of 0.5" (12.7 mm). Before the second pressing step, the coupon was re-cooled to the liquid nitrogen temperature (a temperature as close to −196° C. or 77 K as reasonably possible). The cryogenically pressed coupons were then cryogenically rolled to a final thickness of 0.25" (6.4 mm). During cryogenic rolling, the coupons were recooled after each rolling pass in liquid nitrogen. Initial cooling and re-cooling steps extended until the workpiece no longer boiled the liquid nitrogen that surrounded its surface. Immediately after immersing room temperature metals in liquid nitrogen, the liquid adjacent to the metal surface boiled so rapidly that it formed an unbroken gas film that surrounded the workpiece or underwent "film boiling". During film boiling, the gas barrier limited heat transfer. As the temperature of the workpiece decreased and the metal approached −196° C., the gas film barrier began to break down and the liquid contacted the metal surface before boiling. Heat transfer was relatively rapid during this "nucleate boiling" phenomenon. The boiling rate during nucleate boiling was significantly higher than that of film boiling. An interesting observation from the full-scale trials was that when the workpieces approached −196° C., an audible change in boiling state signaled the transition from film to nucleate boiling.

For comparison purposes, a similar coupon was pressed and rolled the same amounts as the cryogenically-deformed coupons without the cooling steps (i.e. deformation was conducted at ambient temperatures).

Figure 1B:
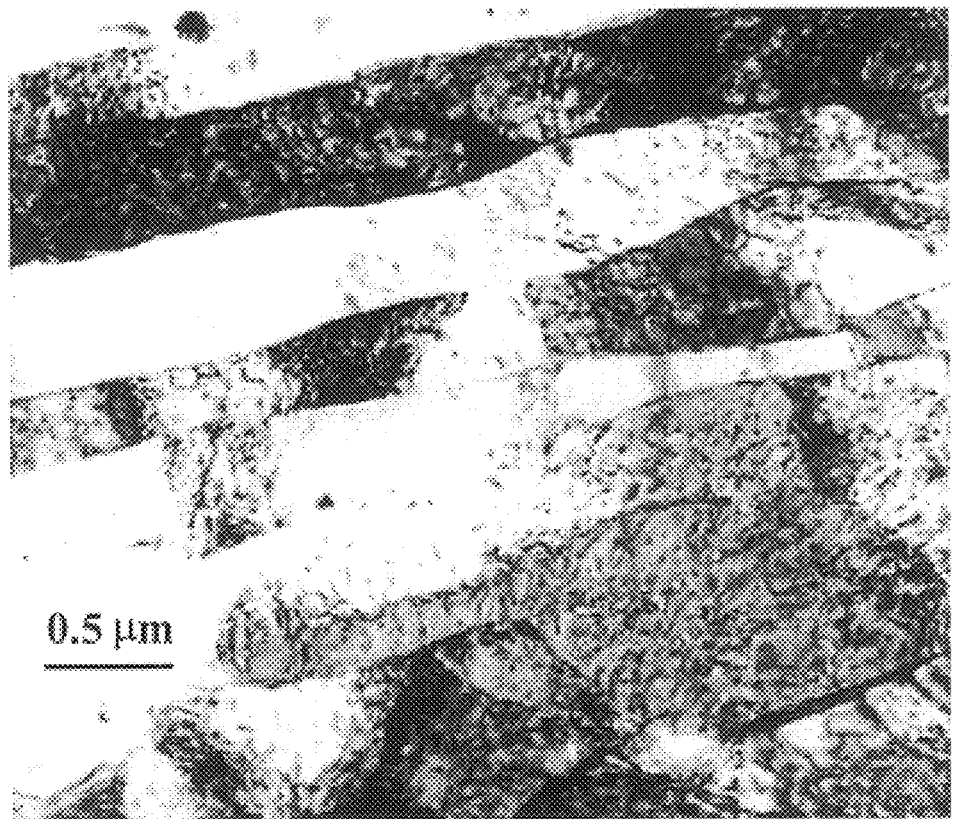
FIG. 1B depicts a transmission electron micrograph of a sample from a cryogenic-worked Al-0.5Cu target blank at a magnification of 33,000×.

Microdiffraction analyses was useful for contrasting microstructures of a specimen deformed with cryogenic deformation processing to those of a control specimen deformed at room temperature. Analyzing each specimen in the as-deformed condition produced two distinct structures. TEM microdiffraction analysis of the room temperature deformed specimen illustrated a low-angle subgrain structure (FIG. 1A). This low-angle subgrain structure was characteristic of aluminum alloys deformed at ambient temperatures. By contrast, the TEM image of an Al-0.5Cu specimen processed at cryogenic temperatures contained high angle boundaries between subgrains (FIG. 1B).

Figure 2:
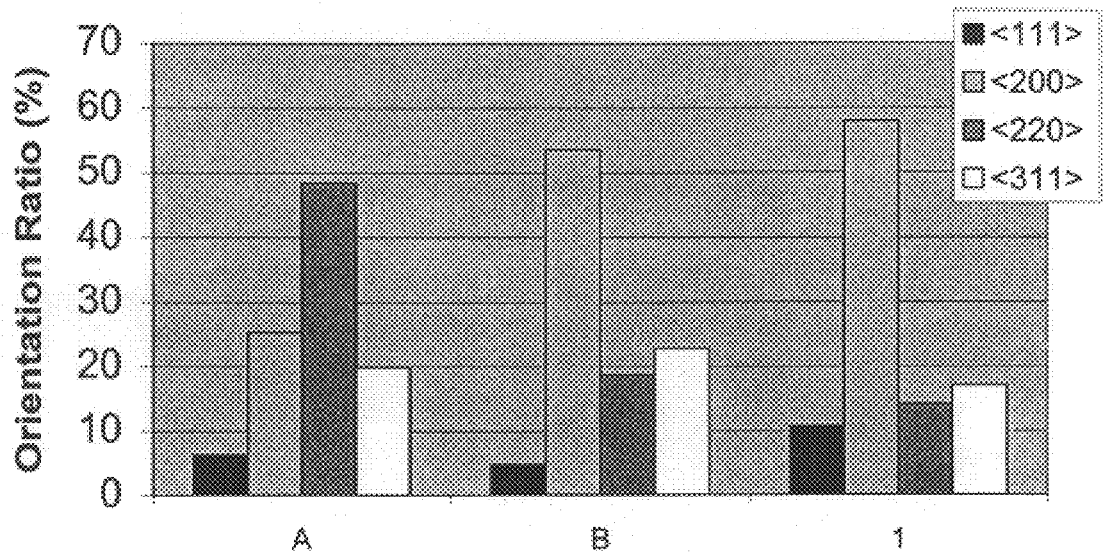
FIG. 2 depicts the comparative crystallographic textures for a comparative process as well as for as-ambient temperature deformed Al-0.5Cu and cryogenic temperature deformed Al-0.5Cu coupons.

Crystallographic texture of as-deformed Al-0.5Cu samples of both ambient-temperature- and cryogenic-temperature-deformed coupons) in this study are compared in FIG. 2. Comparative Coupon A in FIG. 2 shows the as-deformed texture of an Al-0.5Cu sample deformed at ambient temperature, while Cryogenic Coupon 1 shows the as-deformed texture of an Al-0.5Cu sample deformed at cryogenic temperatures. The prior art (relatively coarse grains) crystallographic texture, which is known to be desirable, is also presented in FIG. 2 (Comparative Coupon B) for an ambient-temperature worked and annealed sample. The texture of metastable-unrecrystallized target compared favorably to the comparative sample targets.

EXAMPLE 2

Experimental processing conducted on three sub-sized billets of Al-0.5Cu quantified the strength increase imparted by the cryogenic process. The three processing routes evaluated were as follows: 1) standard processing that involved room temperature pressing and rolling followed by a recrystallizing heat treatment; 2) partial cryogenic processing that involved room temperature pressing and cryogenic rolling; and 3) full cryogenic processing that involved cryogenic pressing and cryogenic rolling. The cryogenic processing followed the cooling and recooling techniques of Example 1.

Figure 3:
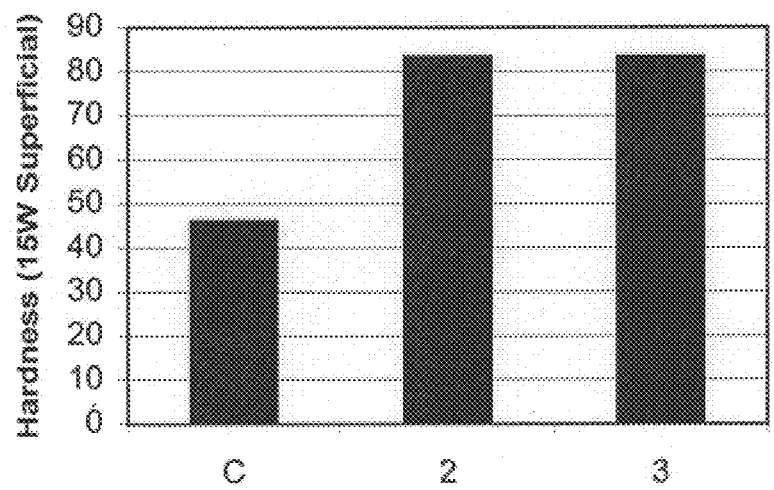
FIG. 3 illustrates increase in hardness (Rockwell 15W Superficial) achieved for cryogenic-processed Al-0.5Cu specimens in comparison to a comparative process.

Referring to FIG. 3, a commercial recrystallized Al-0.5Cu target blank (Comparative Blank B) hardness was approximately 40 points below that of the full and partial cryogenic-processed target blanks. This hardness test revealed no measurable difference in hardness between the partial cryogenic-processing sample (Cryogenic Blank 2) and the full cryogenic-processing sample (Cryogenic Blank 3).

Another benefit of cryogenic-processed targets is their increased strength (resistance to deflection caused by plastic deformation). In order to quantify potential increases in strength, experimental processing was conducted on sub-sized billets of Al-0.5Cu to manufacture mechanical test specimens according to ASTM E-8. As above, the specimens included a specimen produced with standard processing, was compared to a cryogenically-processed specimen (cryogenic pressed and cryogenic rolled, without an annealing treatment).

Figure 4:
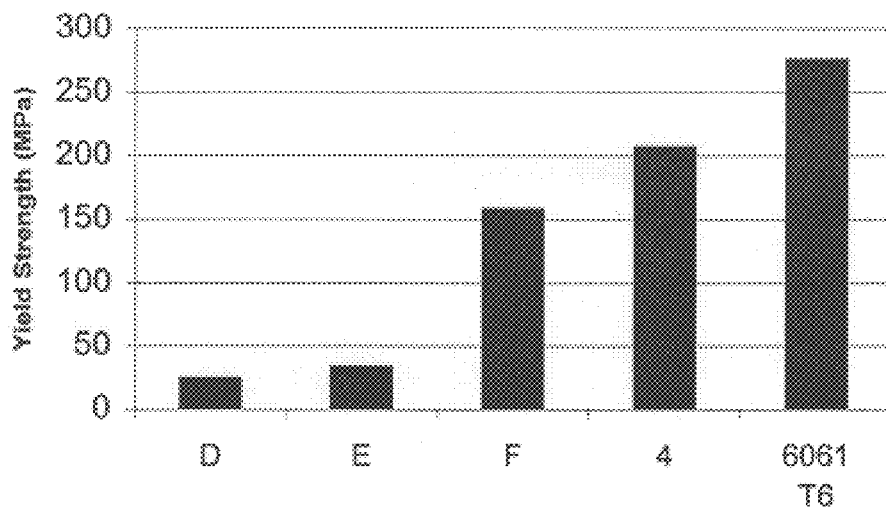
FIG. 4 illustrates increase in yield strength (MPa) achieved for cryogenic-processed Al-0.5Cu specimens in comparison to a comparative process and 6061 T6 aluminum alloy.

Referring to FIG. 4, the standard-recrystallized Al-0.5Cu target blank yield strength (Comparative Blanks D and E) were approximately 175 MPa below that of the cryogenic-processed target blank (Cryogenic Blank 4). For comparison purposes, FIG. 4 includes published data for ECAE ultra-fine grain Al-0.5Cu (Comparative Blank F) for comparative purposes, as well as published data for commercial aluminum alloy 6061 in the T6 condition.

EXAMPLE 3

Five Al-0.5Cu 5.1" (13.0 cm) diameter by 12.5" (31.8 cm)long cylindrical billets provided samples for full-scale processing. This test produced five large spun-formed Endura Al-0.5Cu targets using partial of full cryogenic deformation techniques, with and with out a final annealing step at 200° C. for four hours. Endura targets have the following dimensions: 323 mm diameter and 19.56 mm thickness. The five targets were processed with the conditions listed below.

| ID | Pressing | Rolling | Annealing |
|----|----------|---------|-----------|
| 5  | Cryo     | Cryo    | 200       |
| 6  | Cryo     | Cryo    | No        |
| 7  | Room     | Cryo    | No        |
| 8  | Cryo     | Cryo    | 200       |
| 9  | Room     | Cryo    | No        |

Cryogenic pressing of the billets included the following four pressing steps: 1) 12.5" to 8.0" (31.8 cm to 20.3 cm)[36% reduction], 2) 8.0" to 5.0" (20.3 cm to 12.7 cm)[38% reduction], 3) 5.0" to 3.5" (12.7 cm to 8.9 cm)[30% reduction], and 4) 3.5" to 1.85" (8.9 cm to 4.7 cm) [47% reduction]. The total upset reduction for the pressings was 85%, or a true strain of 1.9. Immersing the billets in a bath of liquid nitrogen brought the billet to cryogenic temperatures. Samples that were ambient-temperature pressed were pressed in a single step.

After deforming all five billets into target blanks, cryogenic rolling reduced the blanks to their final thickness. As described above, immersing the target blanks in liquid nitrogen lowered the workpiece temperature to −196° C. The cryogenic rolling deformed the target blanks from 13" (33 cm) diameter by 1.85" (4.7 cm) thick disks to 18" (45.7 cm) diameter by 0.95" (2.4 cm) thick disks. The reductions per pass were as high as possible to maintain through-thickness deformation homogeneity. The cryogenic rolling reduced the target blanks by 0.100" (0.254 cm) per pass until the blank's thickness approached 1.2" (3.0 cm) thick; and then approximately four more passes at 0.050" (0.127 cm) per pass deformed the blanks to their final specified dimensions of 45.7 cm diameter by 2.4 cm thick (total of 10 to 12 passes). Because these target blanks were thinner than the workpieces processed during the pressing steps, the re-cooling times between each rolling pass were much shorter.

After cryogenically forming target blanks as described above, spin-forming converted flat target banks into Endura-shaped targets with the characteristic "high hat" flange. Spin forming the cryogenically-processed target blanks required additional forces to deform the targets in comparison to conventional spin-forming of annealed blanks.

Figure 5:
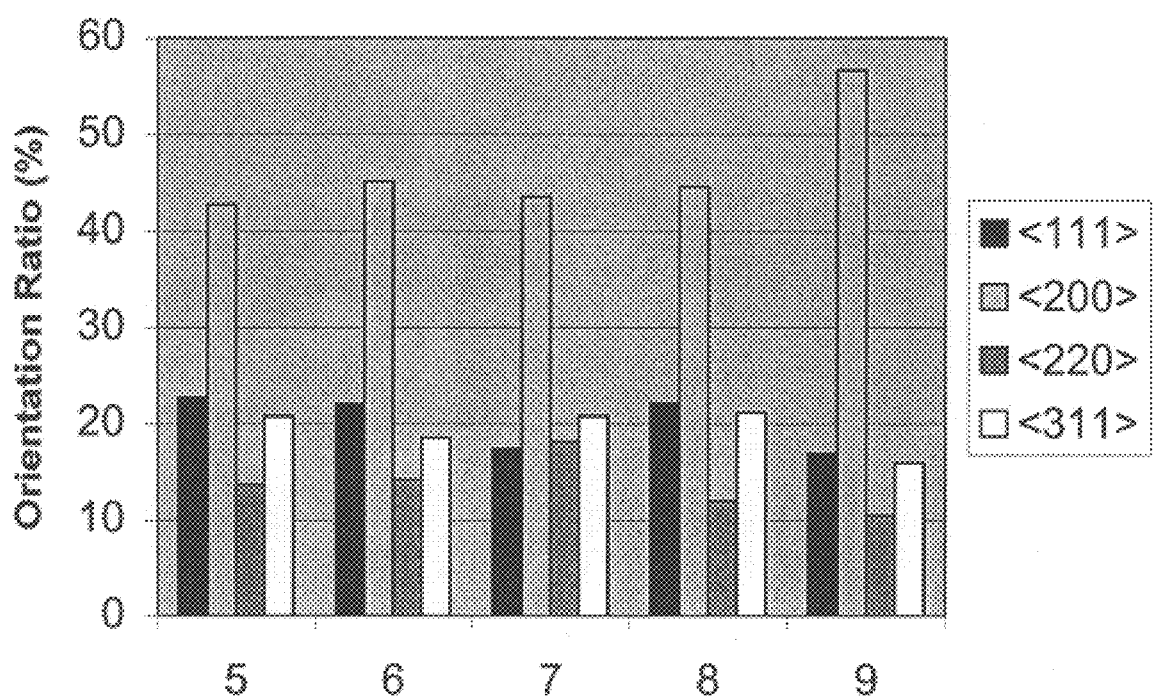
FIG. 5 provides orientation ratios of rough-machined target blanks processed using cryogenic processing.

The cryogenic-processed target blanks were rough-machined at ambient temperature in preparation for the spin forming operation. Referring to FIG. 5, the orientation ratios for all five rough-finished blanks (Cryogenic Blanks 5 to 9) were similar. This indicates that the variations in processing parameters in this Example did not have a significant impact on texture development. The (111) component of the orientation ratios, however was unexpectedly high for all five targets. This unexpected result may have been due to the rough machining operation altering the true texture of the target blanks.

EXAMPLE 4

Figure 6:
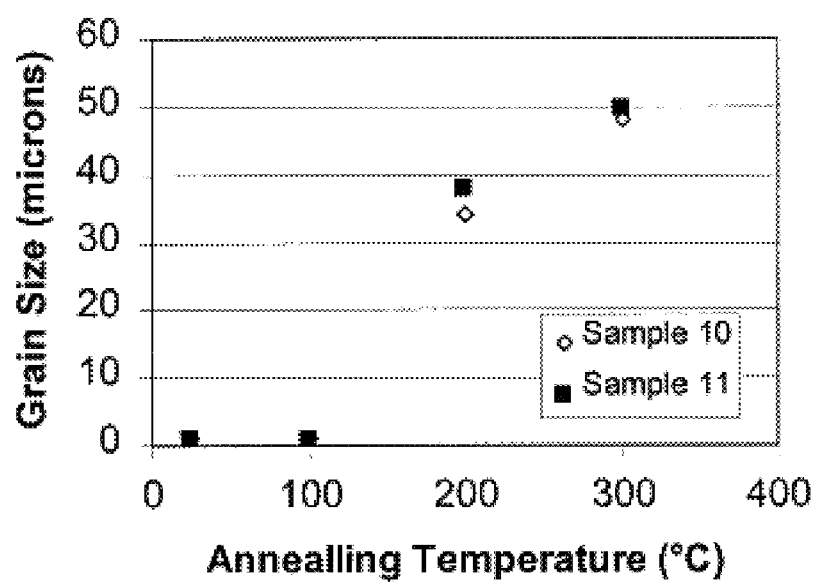
FIG. 6 is a plot of grain size versus annealing temperature for the cryogenic-processed target.

Subjecting two small Al-0.5Cu coupons to the cryogenic working conditions of Example 1 produced the textured-metastable grain structure for stability testing. Then heat treating these samples at 100, 200 and 300° C. for four hours determined stability of the metastable grains at elevated temperatures. Referring to FIG. 6, the grains coarsen (in identically-processed samples 10 and 11) at some temperature between 100 and 200° C. For this reason, it is advantageous to sputter at a temperature less than 200° C.

EXAMPLE 5

Sputter testing of an Al-0.5Cu Endura target manufactured using the cryogenic processing steps described in Example 3 was conducted in an Applied Materials Endura sputtering tool. At a target to wafer spacing of 52 mm, a sputtering power of 11 kW, and an argon pressure of 2.3 mTorr, wafer deposits were made in cycles of 53.5 seconds at a temperature of 200° C. The average Rs uniformity (indirect measurement of deposited film uniformity measured at 49 locations) over the measured life of the target was 0.93%1σ, which is a good result.

Another observation for the ultrafine grained Al-0.5 Cu target was the general absence of microarcing events during sputtering. Aside from some microarcing events that occurred immediately after initial target installation, microarcing was not observed to occur at any other time during sputtering of the tested target.

The process can fabricate targets of any shape including circular-shaped targets and sheet-like-rectangular-shaped targets. Furthermore, since the targets formed from this process have high strength, they also allow forming the targets directly into monoblock structures. This avoids the costs associated with bonding a target to a backing plate and increases the useful thickness of the sputter. With this process, it's possible to achieve minimum grain sizes as fine as 0.2 to 0.5 pm in monoblock-designed aluminum alloy targets. To preserve this ultra-fine-textured-metastable structure it is particularly advantageous to use cooled sputter targets, such as water-cooled sputter targets.

The sputter target's reduced grain size improves sputter uniformity over conventional aluminum alloy sputter targets that are annealed at temperatures above 200° C. In addition, the process provides a more consistent product than conventional wrought methods. In addition, targets manufactured with this process have a yield strength above 100 MPa or even above 150 MPa. Yield strengths of this magnitude should reduce distortion of the sputter target. Finally, the target exhibits a preferred (200) texture that further facilitates uniform sputtering.

Although the invention has been described in detail with reference to certain preferred embodiments, those skilled in the art will recognize that there are other embodiments of the invention within the spirit and the scope of the claims.

We claim:

1. An aluminum alloy sputter target, the sputter target having a sputter target face for sputtering the sputter target, the sputter target face having a textured-metastable grain structure, the textured-metastable grain structure having a grain orientation ratio of at least about 35 percent (200) orientation, the textured-metastable grain structure being stable during sputtering of the sputter target, the textured-metastable grain structure having a grain size of less than about 5 μm.

2. The sputter target of claim 1 wherein the textured-metastable grain structure has less than about 10 percent recrystallized grains.

3. The sputter target of claim 1 wherein the textured-metastable grain structure has a grain orientation ratio of about 5 to 35 percent of each of the (111), (220) and (311) orientations.

4. An aluminum alloy sputter target, the sputter target having a sputter target face for sputtering the sputter target, the sputter target face having a textured-metastable grain structure, the textured-metastable grain structure having a grain orientation ratio of at least about 35 percent (200) orientation, the textured-metastable grain structure being stable during sputtering of the sputter target, the textured-metastable grain structure having a grain size of less than about 2 μm.

5. The sputter target of claim 4 wherein the textured-metastable grain structure has less than about 5 percent recrystallized grains.

6. The sputter target of claim 4 wherein the textured-metastable grain structure has a grain orientation ratio of about 5 to 35 percent of each of the (111) (220) and (311) orientations.

7. An aluminum alloy sputter target, the aluminum alloy being selected from the group consisting of aluminum-copper, aluminum-silicon, and aluminum-copper-silicon alloys, and the sputter target having a sputter target face for sputtering the sputter target, the sputter target face having a textured-metastable grain stricture, the textured-metastable grain structure having a grain orientation ratio of at least about 35 percent (200) orientation, the textured-metastable grain structure being stable during sputtering of the sputter target, the textured-metastable grain structure having a grain size of less than about 1 m.

8. The sputter target of claim 7 wherein the textured-metastable grain structure has less than about 2 percent recrystallized grains.

9. The sputter target of claim 7 wherein the textured-metastable grain structure has a grain orientation ratio of at least about 40 percent (200) orientation and about 5 to 35 percent of each of the (111), (220) and (311) orientations.

10. The sputter target of claim 7 wherein said aluminum alloy is aluminum-0.5 copper, by weight percent and the target has a yield strength of at least 100 MPa.

11. The sputter target of claim 7 wherein the sputter target has a monoblock structure.

* * * * *